US006040113A

United States Patent [19]

Van Damme et al.

[11] Patent Number: 6,040,113
[45] Date of Patent: Mar. 21, 2000

[54] HEAT-SENSITIVE IMAGING ELEMENT FOR MAKING POSITIVE WORKING PRINTING PLATES

[75] Inventors: Marc Van Damme, Heverlee; Joan Vermeersch, Deinze, both of Belgium

[73] Assignee: AGFA-Gevaert, N.V., Mortsel, Belgium

[21] Appl. No.: 09/025,341

[22] Filed: Feb. 18, 1998

Related U.S. Application Data

[60] Provisional application No. 60/040,408, Mar. 11, 1997.

[51] Int. Cl.$^{7}$ .......... G03F 7/00

[52] U.S. Cl. .......... 430/271.1; 430/302; 430/911; 430/926; 430/944

[58] Field of Search .......... 430/271.1, 911, 430/926, 944, 302

[56] References Cited

U.S. PATENT DOCUMENTS

| | | | |
|---|---|---|---|
| 3,615,423 | 10/1971 | Vrancken . | |
| 3,619,157 | 11/1971 | Brinckman . | |
| 3,793,025 | 2/1974 | Vrancken et al. . | |
| 4,004,924 | 1/1977 | Vrancken et al. . | |
| 4,132,168 | 1/1979 | Peterson . | |
| 5,340,693 | 8/1994 | Uytterhoeven et al. | 430/253 |
| 5,340,699 | 8/1994 | Haley et al. | 430/302 |
| 5,536,619 | 7/1996 | Verburgh | 430/273.1 |
| 5,811,215 | 9/1998 | Van Damme et al. | 430/200 |
| 5,840,467 | 11/1998 | Kitatani et al. | 430/302 |

*Primary Examiner*—Cynthia Hamilton
*Assistant Examiner*—Barbara Gilmore
*Attorney, Agent, or Firm*—Breiner & Breiner

[57] ABSTRACT

Heat-sensitive imaging element for making positive working printing plates according to the present invention there is provided a heat-sensitive imaging element for making positive working lithographic printing plates comprising on a lithographic base a layer comprising a polymer, soluble in an aqueous alkaline solution and an IR-radiation sensitive top layer. Upon image-wise exposure the capacity of the aqueous alkaline solution to penetrate and/or solubilize the top layer is changed. Image-wise exposure can be performed with an infrared laser with a short as well as with a long pixel well time.

The obtained positive working printing plates have excellent printing properties and an improved infrared sensitivity.

14 Claims, No Drawings

HEAT-SENSITIVE IMAGING ELEMENT FOR MAKING POSITIVE WORKING PRINTING PLATES

This application claims the benefit of U.S. Provisional Application No. 60/040,408 filed Mar. 11, 1997.

1. FIELD OF THE INVENTION

The present invention relates to a heat-sensitive imaging element for making lithographic printing plates wherein the heat-sensitive imaging element comprises an IR-radiation sensitive top layer. The capacity of this top layer of being penetrated and/or solubilized by an aqueous developer is changed upon exposure.

2. BACKGROUND OF THE INVENTION

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

Alternatively, printing plates are known that include a photosensitive coating that upon image-wise exposure is rendered soluble at the exposed areas. Subsequent development then removes the exposed areas. A typical example of such photosensitive coating is a quinone-diazide based coating.

Typically, the above described photographic materials from which the printing plates are made are camera-exposed through a photographic film that contains the image that is to be reproduced in a lithographic printing process. Such method of working is cumbersome and labor intensive. However, on the other hand, the printing plates thus obtained are of superior lithographic quality.

Attempts have thus been made to eliminate the need for a photographic film in the above process and in particular to obtain a printing plate directly from computer data representing the image to be reproduced. However the photosensitive coating is not sensitive enough to be directly exposed with a laser. Therefore it has been proposed to coat a silver halide layer on top of the photosensitive coating. The silver halide can then directly be exposed by means of a laser under the control of a computer. Subsequently, the silver halide layer is developed leaving a silver image on top of the photosensitive coating. That silver image then serves as a mask in an overall exposure of the photosensitive coating.

After the overall exposure the silver image is removed and the photosensitive coating is developed. Such method is disclosed in for example JP-A 60-61752 but has the disadvantage that a complex development and associated developing liquids are needed.

GB 1.492.070 discloses a method wherein a metal layer or a layer containing carbon black is provided on a photosensitive coating. This metal layer is then ablated by means of a laser so that an image mask on the photosensitive layer is obtained. The photosensitive layer is then overall exposed by UV-light through the image mask. After removal of the image mask, the photosensitive layer is developed to obtain a printing plate. This method however still has the disadvantage that the image mask has to be removed prior to development of the photosensitive layer by a cumbersome processing.

Furthermore methods are known for making printing plates involving the use of imaging elements that are heat-sensitive rather than photosensitive. A particular disadvantage of photosensitive imaging elements such as described above for making a printing plate is that they have to be shielded from the light. Furthermore they have a problem of sensitivity in view of the storage stability and they show a lower resolution. The trend towards heat-sensitive printing plate precursors is clearly seen on the market.

For example, Research Disclosure no. 33303 of January 1992 discloses a heat-sensitive imaging element comprising on a support a cross-linked hydrophilic layer containing thermoplastic polymer particles and an infrared absorbing pigment such as e.g. carbon black. By image-wise exposure to an infrared laser, the thermoplastic polymer particles are image-wise coagulated thereby rendering the surface of the imaging element at these areas ink-acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

U.S. Pat. No. 4,708,925 discloses imaging element including a photosensitive composition comprising an alkali-soluble novolac resin and an onium-salt. This composition can optionally contain an IR-sensitizer. After image-wise exposing said imaging element to UV-visible— or IR-radiation followed by a development step with an aqueous alkali liquid there is obtained a positive or negative working printing plate. The printing results of a lithographic plate obtained by irradiating and developing said imaging element are poor.

EP-A-625728 discloses an imaging element comprising a layer which is sensitive to UV- and IR-irradiation and which can be positive or negative working. This layer comprises a resole resin, a novolac resin, a latent Bronsted acid and an IR-absorbing substance. The printing results of a lithographic plate obtained by irradiating and developing said imaging element are poor.

U.S. Pat. No. 5,340,699 is almost identical with EP-A-625728 but discloses the method for obtaining a negative working IR-laser recording imaging element. The IR-sensitive layer comprises a resole resin, a novolac resin, a latent Bronsted acid and an IR-absorbing substance. The printing results of a lithographic plate obtained by irradiating and developing said imaging element are poor.

Furthermore EP-A-678380 discloses a method wherein a protective layer is provided on a grained metal support underlying a laser-ablatable surface layer. Upon image-wise exposure the surface layer is fully ablated as well as some parts of the protective layer. The printing plate is then treated with a cleaning solution to remove the residue of the protective layer and thereby exposing the hydrophilic surface layer.

The above discussed systems have one or more disadvantages e.g. low infrared sensitivity, need for a pre-heating step (complex processing) or are not imageable at short as well as at long pixel dwell times. So there is still a need for heat-sensitive imaging materials that can be imaged by laser exposure at short as well as at long pixel dwell times and that yields lithographic printing plates with excellent printing properties.

3. SUMMARY OF THE INVENTION

It is an object of the invention to provide a heat-sensitive imaging element for making lithographic printing plates having excellent printing properties, developable in a convenient ecological way.

It is further an object of the present invention to provide a heat-sensitive imaging element for making printing plates having a high infrared sensitivity.

It is also an object of the present invention to provide a heat-sensitive imaging element for making a printing plate of high quality which can be imaged by laser exposure at short as well as at long pixel dwell times.

Further objects of the present invention will become clear from the description hereinafter.

According to the present invention there is provided a heat-sensitive imaging element for making lithographic printing plates comprising on a lithographic base having a hydrophilic surface a hydrophobic layer comprising a polymer, soluble in an aqueous alkaline solution and a top layer that is sensitive to IR-radiation characterized in that said top layer upon exposure to IR-radiation has a decreased or increased capacity for being penetrated and/or solubilised by an aqueous alkaline solution.

According to the present invention there is also provided a method for obtaining lithographic printing plates comprising the steps of image-wise exposing to IR-radiation a heat-sensitive imaging element as described above and developing said exposed imaging element by means of an aqueous alkaline solution. The pixel dwell time of the laser may be comprised between 0.005 $\mu$s and 20 $\mu$s.

4. DETAILED DESCRIPTION OF THE INVENTION

It has been found that according to the present invention, using a heat-sensitive imaging element as described above, lithographic printing plates of high quality can be obtained in an ecologically acceptable way.

A heat-sensitive imaging element in accordance with the present invention comprises on a lithographic base a hydrophobic layer comprising a polymer, soluble in an aqueous alkaline solution and an IR-radiation sensitive top layer.

The top layer, in accordance with the present invention comprises an IR-absorbing compound and a binder resin. Particularly useful IR-absorbing compounds are for example infrared dyes, metal carbides, borides, nitrides, carbonitrides, bronze-structured oxides and oxides structurally related to the bronze family but lacking the A component e.g. $WO_{2.9}$. Preferably carbon black is used as the IR-absorbing compound. As a binder resin gelatin, cellulose, cellulose esters e.g. cellulose acetate, polyvinyl alcohol, polyvinyl pyrrolidone, a copolymer of vinylidene chloride and acrylonitrile, poly(meth)acrylates, polyvinyl chloride, silicone resins etc. can be used. Preferred as binder resin is nitrocellulose.

In the top layer a difference in the capacity of being penetrated and/or solubilized by the aqueous alkaline solution is generated upon image-wise exposure. A difference in the capacity of the top layer to be penetrated and/or solubilised by a developing solution can be obtained by a thermally induced physical or chemical transformation. Examples of thermally induced physical transformations which generate a difference in said capacity are: laser induced coalescence of hydrophobic polymer particles in a hydrophilic binder as described in EP-A 952022871.0, 952022872.8, 952022873.6 and 952022874.4, which creates a reduction in the capacity of being penetrated and/or solubilized in the exposed areas and laser induced removal of material which creates an increase in the capacity in the exposed areas of the layer for penetration and/or solubilization by the developing solution. Examples of thermally induced chemical transformations which generate a difference in the capacity of the layer for penetration and/or solubilization by a developer are: laser induced change in polarity which increases the said capacity in the exposed areas and laser induced crosslinking which reduces the said capacity in the exposed areas. The change in said capacity created upon laser exposure, should be high enough to allow a complete clean-out without damaging and/or solubilizing the resulting image upon development with an aqueous alkaline solution.

In the preferred case that the said capacity is increased upon image-wise laser exposure, the imaged parts will be cleaned out during development without solubilizing and/or damaging the non-imaged parts.

In the case that the said capacity is decreased upon image-wise laser exposure, the non-imaged parts will be cleaned out during development without solubilizing and/or damaging the imaged parts.

The development with the aqueous alkaline solution is preferably done within an interval of 5 to 120 seconds.

In addition to the IR-sensitive compound the top layer may comprise a compound sensitive to visible light and/or UV-radiation to sensitise this layer to visible light and/or UV-radiation.

Between the top layer and the lithographic base the present invention comprises a hydrophobic layer soluble in an aqueous developing solution more preferably an aqueous alkaline developing solution with preferentially a pH between 7.5 and 14. The hydrophobic binders used in this layer are preferably hydrophobic binders as used in conventional positive or negative working PS-plates e.g. novolac, polyvinyl phenols, carboxy substituted polymers etc. Typical examples of these polymers are described in DE-A-4007428, DE-A-4027301 and DE-A-4445820. The hydrophobic binder used in connection with the present invention is further characterised by insolubility in water and partial solubility/swellability in an alkaline solution and/or partial solubility in water when combined with a cosolvent. Furthermore this aqueous alkali soluble layer is preferably a visible light- or UV-desensitised layer that is thermally hardenable and ink-accepting. This visible light- or UV-desensitised layer does not comprise photosensitive ingredients such as diazo compounds, photoacids, photoinitiators, quinone diazides, sensitisers etc. which absorb in the wavelength range of 250 nm to 650 nm. In this way a daylight stable printing plate can be obtained. Furthermore the IR-radiation sensitive top layer can be partially solubilised in the aqueous alkali soluble layer upon exposure.

In the imaging element according to the present invention, the lithographic base can be an anodised aluminum. A particularly preferred lithographic base is an electrochemically grained and anodised aluminum support. The anodised aluminum support may be treated to improve the hydrophilic properties of its surface. For example, the aluminum support may be silicated by treating its surface with sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or can be carried out at a slightly elevated temperature of about 30 to 50° C. A further interesting treatment involves rinsing the aluminum oxide surface with a bicarbonate solution. It is further evident that one or more of these post treatments may be carried out alone or in combination. More detailed descriptions of these treatments are given in GB 1.084.070, DE-A-4423140, DE-A-4417907, EP-A-659909, EP-A-537633, DE-A-4001466, EP-A-292801, EP-A-291760 and U.S. Pat. No. 4,458,005.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stöber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 $\mu$m and is preferably 1 to 10 $\mu$m.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525.

Preferably, the amount of silica in the adhesion improving layer is between 200 mg per m$^2$ and 750 mg per m$^2$. Further, the ratio of silica to hydrophilic binder is preferably more than 1 and the surface area of the colloidal silica is preferably at least 300 m$^2$ per gram, more preferably at least 500 m$^2$ per gram.

Image-wise exposure in connection with the present invention is an image-wise scanning exposure involving the use of a laser that operates in the infrared or near-infrared, i.e. wavelength range of 700–1500 nm. Most preferred are laser diodes emitting in the near-infrared. Exposure of the imaging element can be performed with lasers with a short as well as with lasers with a long pixel dwell time. Preferred are lasers with a pixel dwell time between 0.005 $\mu$s and 20 $\mu$s.

After the image-wise exposure the heat-sensitive imaging element is developed by rinsing it with an aqueous alkaline solution. The aqueous alkaline solutions used in the present invention are those that are used for developing conventional positive or negative working presensitized printing plates and have a pH between 7.5 and 14. Thus the imaged parts of the top layer that were rendered more penetrable for the aqueous alkaline solution upon exposure and the parts of the underlying layer are cleaned-out whereby a positive working printing plate is obtained. To obtain a negative working printing plate, the laser imaged parts of the layer are rendered less penetrable for the aqueous alkaline solution upon image-wise exposure, thus the non-imaged parts of the top layer and the parts of the underlying layer are cleaned out.

According to another embodiment of the method in accordance with the present invention, the imaging element is first mounted on the printing cylinder of the printing press and then image-wise exposed directly on the press. Subsequent to exposure, the imaging element can be developed as described above.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in “Grafisch Nieuws” ed. Keesing, 15, 1995, page 4 to 6.

After the development of an image-wise exposed imaging element with an aqueous alkaline solution and drying, the obtained plate can be used as a printing plate as such. However, to improve durability it is still possible to bake said plate at a temperature between 200° C. and 300° C. for a period of 30 seconds to 5 minutes. Also the imaging element can be subjected to an overall post-exposure to UV-radiation to harden the image in order to increase the run length of the printing plate.

The following example illustrates the present invention without limiting it thereto. All parts and percentages are by weight unless otherwise specified.

EXAMPLES

Example 1

Positive working thermal plate based on an alkali-soluble binder.

IR-laser exposure with short pixel dwell time (0.05 μs).

Preparation of the Lithographic Base

A 0.20 mm thick aluminum foil was degreased by immersing the foil in an aqueous solution containing 5 g/1 of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 $A/m^2$ to form a surface topography with an average center-line roughness Ra of 0.5 μm. After rinsing with demineralized water the aluminum foil was then etched with an aqueous solution containing 300 g/l of sulfuric acid at 60° C. for 180 seconds and rinsed with demineralized at 25° C. for 30 seconds. The foil was subsequently subjected to anodic oxidation in an aqueous solution containing 200 g/l of sulfuric acid at a temperature of 45° C., a voltage of about 10 V and a current density of 150 $A/m^2$ for about 300 seconds to form an anodic oxidation film of 3.00 $g/m^2$ of $Al_2O_3$, then washed with demineralized water, posttreated with a solution containing 20 g/l of sodium bicarbonate at 40° C. for 30 seconds, subsequently rinsed with demineralized water at 20° C. during 120 seconds and dried.

Preparation of the Imaging Element

On a lithographic base was first coated a 5% by weight solution of MARUKA LYNCUR M H-2 (homopolymer of polyvinylphenol from Maruzen Co.) in methyl ethyl ketone to a wet thickness of 20 μm. This layer was dried for 10 minutes at 40° C. Upon this layer was then coated, with a wet coating thickness of 20 μm, the IR-sensitive formulation on basis of a carbon black dispersion, with the following ingredients in parts by weight, as indicated.

Ethylacetate 579.7

Butylacetate 386.5

Special Schwarz 250 (carbon black available from Degussa) 16.7

Nitrocellulose E950 (available from Wolff Walsrode) 12.3

Solsperse 5000 (wetting agent available from ICI) 0.3

Solsperse 28000 (wetting agent available from ICI) 1.7

Cymel 301 (melamine hardener available from Dyno Cyanamid) 2.3 p-toluene sulfonic acid 0.5

The IR-sensitive coating was dried for 2 minutes at 120° C.

Imagewise Exposure and Processing of the Imaging Element

The IR-sensitive printing plate was subjected to a scanning NdYAG infrared laser emitting at 1064 nm in an internal drum configuration (scan speed 218 m/s, pixel time 0.05 μs, spot size 14 μm and the power on the surface of the imaging element was varied from 2 Watts to 6 Watts). After this exposure the IR-sensitive mask has partly disappeared in areas exposed to the laser-beam. Further the imaging element was subjected to a developing process with Ozasol EP26 (aqueous alkaline developing solution available from AGFA), hereby removing the IR-imaged parts and resulting in a positive printing plate. After processing, the printing plate was mounted on a GTO46 offsetpress. As an ink was used K+E 123W and as a fountain solution Rotamatic. Printing was started and a good printing quality was obtained without any ink uptake in the IR-imaged parts.

Example 2

Positive working thermal plate based on an alkali-soluble binder.

IR-laser exposure with long pixel dwell time (2.4 μs).

The imaging element of example 1 was subjected to a scanning NdYlf-laser emitting at 1050 nm (scanspeed 4.4 m/s, pixel time 2.4 μs, spot size 15 μm and the power on plate surface was varied from 75 to 475 mW ). After this exposure the IR-sensitive mask has partly disappeared in areas exposed to the laser-beam. Further the imaging element was subjected to a developing process with Ozasol EP26 (aqueous alkaline developing solution available from AGFA), hereby removing the IR-imaged parts and resulting in a positive printing plate. After processing, the printing plate was mounted on a GTO46 offsetpress. As an ink was used K+E 123W and as a fountain solution Rotamatic. Printing was started and a good printing quality was obtained without any ink uptake in the IR-imaged parts.

Example 3

Positive working thermal plate based on a thermally hardenable alkali-soluble layer composition.

Preparation of the Lithographic Base see example 1

Preparation of the Imaging Element

On a lithographic base was first coated a 5% by weight solution of a thermally hardenable composition in methyl ethyl ketone to a wet thickness of 20 μm. The resulting dry alkaline soluble, thermally hardenable layer had the following composition: 65% w/w MARUKA LYNCUR M H-2 (homopolymer of polyvinylphenol from Maruzen Co.), 30% CYMEL 303 (hexamethoxymethyl melamine from Dyno Cyanamid), 5% w/w TRIAZINE S (2,4,6-(trichloromethyl)-s-triazine from PCAS). This layer was dried for 10 minutes at 40° C. Upon this layer was then coated, with a wet coating thickness of 20 μm, the IR-sensitive formulation on basis of a carbon black dispersion, with the following ingredients in parts by weight, as indicated.

Ethylacetate 579.7

Butylacetate 386.5

Special Schwarz 250 (carbon black available from Degussa) 16.7

Nitrocellulose E950 (available from Wolff Walsrode) 12.3

Solsperse 5000 (wetting agent available from ICI) 0.3

Solsperse 28000 (wetting agent available from ICI) 1.7

Cymel 301 (melamine hardener available from Dyno Cyanamid) 2.3 p-toluene sulfonic acid 0.5

The IR-sensitive coating was dried for 2 minutes at 120° C.

Imagewise Exposure and Processing of the Imaging Element

The IR-sensitive printing plate was subjected to a scanning Nd YAG infrared laser emitting at 1064 nm in an internal drum configuration (scan speed 218 m/s, pixel time 0.05 μs, spot size 14 μm and the power on the surface of the imaging element was varied from 2 Watts to 6 Watts). After this exposure the IR-sensitive mask has partly disappeared in areas exposed to the laser-beam. Further the imaging element was subjected to a developing process with Ozasol EP26 (aqueous alkaline developing solution available from AGFA), hereby removing the IR-imaged parts and resulting in a positive printing plate. Then the resulting printing plate was post-baked for 2 minutes at 200° C. to induce thermal hardening. This resulted in a printing plate with a higher run length compared to example 1.

Example 4

Positive working thermal plate based on a UV-sensitive layer which is alkali-soluble.

Preparation of the Imaging Element

On an Ozasol N61 printing plate was coated an IR-sensitive formulation on basis of a carbon black dispersion, with the following ingredients in parts by weight, as indicated.

Ethylacetate 579.7

Butylacetate 386.5

Special Schwarz 250 (carbon black available from Degussa) 16.7

Nitrocellulose E950 (available from Wolff Walsrode) 12.3

SOLSPERSE 5000 (wetting agent available from ICI) 0.3

SOLSPERSE 28000 (wetting agent available from ICI) 1.7

Cymel 301 (melamine hardener available from Dyno Cyanamid) 2.3 p-toluene sulfonic acid 0.5

The UV-sensitive layer of the Ozasol N61 printing plate was coated by means of a knife coater with the IR-sensitive formulation to a wet coating thickness of 20 μm. The IR-sensitive coating was dried for 2 minutes at 120° C.

Imagewise Exposure and Processing of the Imaging Element

The IR-sensitive printing plate was subjected to a scanning Nd YAG infrared laser emitting at 1064 nm in an internal drum configuration (scan speed 218 m/s, pixel time 0.051 μs, spot size 14 μm and the power on the surface of the imaging element was varied from 2 Watts to 6 Watts). After this exposure the IR-sensitive mask has partly disappeared in areas exposed to the laser-beam. Further the imaging element was subjected to a developing process with Ozasol EN143 (developing solution available from AGFA), hereby removing the IR-imaged parts and resulting in a positive printing plate. After processing, the printing plate was mounted on a GTO46 offsetpress. As an ink was used K+E 123W and as a fountain solution Rotamatic. Printing was started and a good printing quality was obtained without any ink uptake in the IR-imaged parts.

Example 5

Positive working thermal plate based on an alkali-soluble binder.

IR-laser exposure with short pixel dwell time (0.05 μs).

Preparation of the Lithographic Base

See example 1

Preparation of the Imaging Element

On a lithographic base was first coated a 5% by weight solution of ALVONOL PN429 (cresol novolac from Hoechst) and 3,4,5-trimethoxybenzoic acid (from Aldrich) (ratio 88:12) in methyl ethyl ketone to a wet thickness of 20 μm. This layer was dried for 30 seconds at 120° C. Upon this layer was then coated, with a wet coating thickness of 20 μm, the IR-sensitive formulation on basis of a carbon black dispersion, with the following ingredients in parts by weight, as indicated.

Ethylacetate 900.0

Butylacetate 600.0

Special Schwarz 250 (carbon black available from Degussa) 22.0

Nitrocellulose E950 (available from Wolff Walsrode) 2.2

SOLSPERSE 5000 (wetting agent available from IC) 0.44

SOLSPERSE 28000 (wetting agent available from ICI) 2.2

The IR-sensitive coating was dried for 30 seconds at 120° C.

Imagewise Exposure and Processing of the Imaging Element

The IR-sensitive printing plate was subjected to a scanning NdYAG infrared laser emitting at 1064 nm in an internal drum configuration (scan speed 218 m/s, pixel time 0.05 μs, spot size 14 μm and the power on the surface of the imaging element was varied from 2 Watts to 6 Watts). After this exposure the IR-sensitive mask has partly disappeared in areas exposed to the laser-beam. Further the imaging element was subjected to a developing process with Ozasol EP26 (aqueous alkaline developing solution available from AGFA) diluted with 10%, hereby removing the IR-imaged parts and resulting in a positive printing plate. After processing, the printing plate was mounted on a GTO46 offsetpress. As an ink was used K+E 123W and as a fountain solution Rotamatic. Printing was started and a good printing quality was obtained without any ink uptake in the IR-imaged parts.

Example 6

Positive working thermal plate based on an alkali-soluble binder.

IR-laser exposure with long pixel dwell time (2.4 μs).

The imaging element of example 5 was subjected to a scanning NdYlf-laser emitting at 1050 nm (scanspeed 4.4 m/s, pixel dwell 2.4 μs, spot size 15 μm and the power on the plate surface was varied from 75 to 475 mW). After this exposure the IR-sensitive mask has partly disappeared in the areas exposed to the laser-beam. Further the imaging element was subjected to a developing process with Ozasol EP26 (aqueous alkaline developing solution available from AGFA) diluted with 10% water, hereby removing the IR-imaged parts and resulting in a positive printing plate. After processing, the printing plate was mounted on a GTO46 offsetpress. As an ink was used K+E 123W and as a fountain solution Rotamatic. Printing was started and a good printing quality was obtained without any ink uptake in the IR-imaged parts.

We claim:

1. A heat sensitive imaging element for making a lithographic printing plate comprising on a lithographic base having a hydrophilic surface;

a hydrophobic layer un-sensitive to visible and UV light comprising a hydrophobic polymer soluble in an aqueous alkaline solution and a top layer having a decreased or increased capacity for being penetrated and/or solubilized by an aqueous alkaline solution comprising a compound sensitive to IR-radiation.

2. A heat-sensitive imaging element according to claim 1 where upon image-wise laser exposure the capacity of the top layer to be penetrated and/or solubilized is increased, said increase leads to a clean-out of the laser imaged parts without solubilized and/or damaging the non-imaged parts upon developing said laser-imaged imaging element with an aqueous alkaline solution.

3. A heat-sensitive imaging element according to claim 1 wherein upon image-wise exposure the capacity of the top layer to be penetrated and/or solubilized is decreased, said decrease leads to a clean-out of the non-imaged parts without solubilising and/or damaging the laser imaged parts upon developing said laser exposed imaging element with an aqueous alkaline solution.

4. A heat-sensitive imaging element according to claim 1 wherein said hydrophobic layer soluble in an aqueous alkaline solution comprising a polymer is a thermally hardenable layer.

5. A heat-sensitive imaging element according to claim 1 wherein said hydrophobic binder is characterized by insolubility in water and a. partial solubility or swellability in an aqueous alkaline solution and/or b. partial solubility in water when combined with a cosolvent.

6. A heat-sensitive imaging element according to claim 1 wherein said hydrophobic binder is selected from the group consisting of novolacs, polyvinyl phenols, carboxy substituted polymers.

7. A heat-sensitive imaging element according to claim 1 wherein said IR-laser sensitive top layer comprises nitrocellulose.

8. A heat-sensitive imaging element according to claim 1 wherein said laser sensitive top layer comprises a light absorbing compound sensitive to:

near IR-radiation and/or visible radiation and/or

UV-radiation.

9. A method for making lithographic printing plates comprising the steps of image-wise exposing a heat-sensitive imaging element comprising on a lithographic base having a hydrophilic surface, an aqueous alkaline soluble layer un-sensitive to visible and UV light comprising a hydrophobic polymer and a top layer comprising an IR-sensitive compound and developing said imaging element.

10. A method according to claim 9 wherein the heat sensitive imaging element is exposed to a laser and the pixel dwell time of the laser is comprised between 0.005 μs and 20 μs.

11. A method according to claim 9 wherein said developing with an aqueous developing solution is done within an interval of 5 to 120 seconds.

12. A method according to claim 9 whereby the obtained printing plate is overall post-exposed to UV-radiation.

13. A method according to claim 9 wherein said aqueous developing solution is an aqueous alkaline solution with a pH between 7.5 and 14.

14. A method according to claim 9 whereby the obtained printing plate is post-baked in an additional step.

* * * * *